United States Patent [19]

Goto et al.

[11] Patent Number: 5,434,363
[45] Date of Patent: Jul. 18, 1995

[54] METALLIC WIRING BOARD

[75] Inventors: Masahito Goto, Tenri; Hiroshi Morimoto, Kitakatsuragi; Yasunori Shimada; Takayoshi Nagayasu, both of Nara; Mitsuaki Hirata, Tenri; Yoshitaka Hibino, Nara; Tomohiko Yamamoto, Tenri, all of Japan

[73] Assignee: Sharp Kabushiki Kaisha, Osaka, Japan

[21] Appl. No.: 86,708

[22] Filed: Jul. 7, 1993

[51] Int. Cl.⁶ .............................................. H05K 1/09
[52] U.S. Cl. ................................... 174/256; 174/257; 174/258
[58] Field of Search ...................... 174/256, 257, 258; 361/750, 751

[56] References Cited

U.S. PATENT DOCUMENTS 5,266,815  11/1993  Sunami et al. ................... 257/30
5,294,560   3/1994  Ono et al. ........................ 437/47

FOREIGN PATENT DOCUMENTS 0313199   4/1989  European Pat. Off. .
0423884   4/1991  European Pat. Off. .
0453324  10/1991  European Pat. Off. .

OTHER PUBLICATIONS

Patent Abstracts of Japan, vol. 313, No. 277 (E-778) 26 Jun. 1989 & JP-A-01 064 253 (Ricoh Co. Ltd.) 10 Mar. 1989.
Patent Abstracts of Japan, vol. 7, No. 264 (E-212) 24 Nov. 1983 & JP-A-58 147 069 (Sharp KK).
Wyatt, *IEEE Transactions on Components, Hybridgs, and Manufacturing Technology*, vol. CHMT-1, No. 2, pp. 148-151, Jun. 1978.

Primary Examiner—Leo P. Picard
Assistant Examiner—L. Thomas
Attorney, Agent, or Firm—Nixon & Vanderhye

[57] ABSTRACT

A metallic wiring board includes nitrogen implanted in a surface of a substrate or a protective layer including nitrogen formed on the substrate upon which is formed a metallic film including, as a main component, one of Ta and Nb. An insulating film covering the metallic wiring is formed by anodic oxidation. The nitrogen in the substrate or the protective layer prevents Ta (or Nb) ions from entering the substrate during the anodic oxidation of the metallic wiring. As a result, insulating properties of the substrate are not degraded during the oxidation.

16 Claims, 9 Drawing Sheets

METALLIC WIRING BOARD

BACKGROUND OF THE INVENTION

1. Field of the Invention

The present invention relates to a metallic wiring board for an active matrix substrate used in an active matrix type liquid crystal display and the like and relates to a method for producing such a metallic wiring board.

2. Description of the Related Art

In recent years, a flat panel display has been earnestly studied, because it is a promising display that is thinner and lighter than a CRT (cathode ray tube) and it can be used in a personal computer or a word processor. A liquid crystal display, that is, a kind of the flat panel display, has been mainly developed recently because it is advantageous in color display since it spends little electric power and is not luminary. Especially, a liquid crystal display of an active matrix driving system using a thin film transistor (hereinafter referred to as the "TFT") is advantageous because of its quick response and a high display quality. Especially, in a TFT using amorphous silicon (hereinafter referred to as "a-Si"), a thin film can be formed at a low temperature. Therefore, such a TFT can provide a display with a large screen and a high resolution at a low cost. Accordingly, the technological development of such a TFT has been a matter of concern.

FIG. 13 is a plan view of a TFT portion in a conventional metallic wiring board. FIG. 14 is a sectional view of the TFT of FIG. 13 taken on line C—C. A source line 111 as a signal line and a gate line 104 as a scanning line are formed on an insulating glass substrate 101 longitudinally and horizontally, respectively. The TFT 100 is formed near the intersection thereof and works as a switching element of a liquid crystal display.

The metallic wiring board comprises, as is shown in FIGS. 13 and 14, the glass substrate 101 on the bottom, the gate line 104 formed on the glass substrate 101 and a first insulating film 105 formed on the gate line 104. The gate line 104 includes a little wider portion as a gate electrode 103 of the TFT 100.

The metallic wiring board further has a second insulating film 106 made from $SiN_x$, a semiconductor layer 107 formed from a-Si on the second insulating film 106, a third insulating film 108 formed from $SiN_x$ on the center of the semiconductor layer 107, and semiconductor layers 109a and 109b made from a-Si doped with phosphorus (P). The second insulating film 106 covers the entire top surface of the glass substrate 101 bearing the gate line 104 and the first insulating film 105. The semiconductor layer 107 totally covers the gate electrode 103. The semiconductor layers 109a and 109b are formed so as to cover the semiconductor layer 107 and the edges of the third insulating film 108.

Moreover, the metallic wiring board has the source line 111 made from a metallic material such as molybdenum (Mo) and titanium (Ti) on the second insulating film 106 and a source electrode 110 branched from the source line 111. The source electrode 110 covers the whole of the semiconductor layer 109a and part of the second insulating film 106. The metallic wiring board further has a drain electrode 112 that covers the whole of the semiconductor layer 109b and part of the second insulating film 106, and a transparent pixel electrode 113 formed on the second insulating film 106 so as to be in contact with the drain electrode 112. The drain electrode 112 is made from the same material as that used for the source line 111 and the pixel electrode 113 is made from indium oxide or the like.

The production method for such a metallic wiring board is as follows:

A tantalum (Ta) film is first coated on the glass substrate 101 by a sputtering method. The Ta film is patterned to form the gate electrode 103 and the gate line 104. The first insulating film 105 is formed by anodic oxidation of the surfaces of the gate electrode 103 and the gate line 104. The first insulating film 105 and the glass substrate 101 are then coated with $SiN_x$ by a plasma CVD to form the second insulating film 106.

Next, the semiconductor layer 107 and the third insulating film 108 made from $SiN_x$ are formed in this order by the plasma CVD above the gate electrode 103 covered with the second insulating film 106. The semiconductor layers 109a and 109b are then formed so as to cover the edges of the third insulating film 108 and the whole of the semiconductor layer 107.

A metal such as Mo and Ti is coated thereon so as to cover the whole of the semiconductor layer 109a and part of the second insulating film 106 to form the source electrode 110 and the source line 111. The drain electrode 112 is formed so as to cover the whole of the semiconductor layer 109b and part of the second insulating film 106. Indium oxide or the like is then coated on the second insulating film 106 so as to come in contact with the drain electrode 112 to form the transparent pixel electrode 113. The semiconductor layers 109a and 109b are formed to provide an ohmic contact between the semiconductor layer 107 and the source electrode 110 and between the semiconductor layer 107 and the drain electrode 112.

The anodic oxidation is a method for improving the insulating property between the metallic wirings, that is, between the gate line 104 and the source line 111 and between the gate line 104 and the drain electrode 112. This method does not require complicated production steps and enables the formation of the first insulating film 105 without decreasing the yield. However, since the glass substrate 101 is subjected to a bias stress aging in the anodic oxidation process, the insulating property around the interface between the first insulating film 105 and the glass substrate 101 is degraded, causing a point defect in the liquid crystal display and degrading the quality of the displayed image. This problem is caused also in the case where a protective layer is provided on the substrate. In this case, the insulating property of the protective layer degrades during the anodic oxidation of the gate line and the gate electrode formed on the protective layer.

One of the significant elements for producing a liquid crystal display with a large screen and a high resolution is the low resistance of the metallic wiring. When the material for the metallic wiring has a low resistance, the metallic wiring can be made thin and long. As a result, pixels can be made smaller and aligned longer.

In a conventional liquid display, various kinds of metals such as Ta and Ti are used as the metallic wiring. In spite of these materials, a conventional production method limits the low resistance of a metallic film. The reason will now be described by using Ta as an example of such metallic materials.

Ta has two kinds of crystal structures: one is a tetragonal lattice and the other is a body-centered cubic lattice. The Ta having the tetragonal lattice is called $\beta$-Ta, and the thin film made from β-Ta has a specific resistance ρ of 170 to 220 $\mu\Omega$cm. The Ta having the body-centered cubic lattice is called α-Ta, and the thin film made from α-Ta has a specific resistance ρ of 13 to 15 $\mu\Omega$cm. Therefore, α-Ta should be formed in order to obtain a Ta film with a low resistance. Most of the Ta thin films are generally made from β-Ta. In a well known method to form an α-Ta film, a small amount of nitrogen (N) is mixed in the material when forming a thin film. However, the nitrogen that has been mixed also works as an impurity, thereby limiting the low resistance of the Ta film. The Ta film formed by this method has a specific resistance of 60 to 100 $\mu\Omega$cm.

In a liquid crystal display using a metallic wiring with a high specific resistance, when a pixel is made small in order to attain a high resolution, it is impossible to make the metallic wiring thin. As a result, the ratio of the area occupied by the metallic wiring in the whole pixel is large, thereby darkening the displayed image. Thus, the quality of the displayed image is lowered.

SUMMARY OF THE INVENTION

The metallic wiring board of this invention comprises a substrate including nitrogen on a surface thereof; and a metallic wiring formed by sputtering Ta on the surface of the substrate.

Alternatively, the metallic wiring board of this invention comprises a substrate including nitrogen on a surface thereof; a metallic wiring formed on the substrate and made from a metal including, as a main component, one of Ta and Nb; and an anodic-oxidized layer of the metal wiring.

In one embodiment, the substrate has a protective layer including nitrogen on a surface thereof; the metallic wiring is formed by sputtering Ta on the protective layer.

In one embodiment, the protective layer is made from a metal including, as a main component, one of $SiO_2$, $SiN_x$ and $Ta_2O_5$.

The method for producing a metallic wiring board of this invention comprises the steps of: implanting nitrogen on a surface of a substrate; forming a metallic film including, as a main component, one of Ta and Nb on the surface of the substrate where nitrogen is implanted by a sputtering method to form a metallic wiring by patterning the metallic film; and forming an insulating film by an anodic oxidation of a surface of the metallic wiring.

Alternatively, the method for producing a metallic wiring board of this invention comprises the steps of: forming on a substrate a protective layer which is obtained by implanting nitrogen on a surface thereof and is made from a metal including, as a main component, one of $SiO_2$, $SiN_x$ and $Ta_2O_5$; forming a metallic film including, as a main component, one of Ta and Nb by a sputtering method on the surface of the protective layer where nitrogen is implanted to form a metallic wiring by patterning the metallic film; and forming an insulating film by an anodic oxidation of a surface of the metallic wiring.

In one embodiment, the protective layer includes $Ta_2O_5$ as a main component and is formed by a sputtering method by using a gas including nitrogen, the $Ta_2O_5$ being obtained by a heat oxidation of a Ta film with a specific resistance of 220 $\mu\Omega$cm or less.

In the step of forming a metallic wiring from Ta or Nb on a substrate or a protective layer including nitrogen to anodic-oxidize the surface of the metallic wiring, Ta ions or Nb ions do not enter the substrate or the protective layer.

Further, a substrate or a protective layer is doped with nitrogen, and a Ta layer is formed by the sputtering method thereon. The sputtering method has a characteristic that a material contained in the substrate is mixed into a film formed in the initial stage of the coating. Therefore, the doped nitrogen enters the Ta film, and a thin α-Ta layer is formed on the substrate or the protective film. The Ta layer to be epitaxially grown thereon is an α-Ta layer including no impurity. Thus, a Ta layer with a specific resistance of about 25 $\mu\Omega$cm is obtained.

Thus, the invention described herein makes possible the advantages of (1) providing a metallic wiring board with an improved quality for a displayed image by preventing degradation of the insulating property of a substrate and a protective layer and by decreasing the number of point defects in the displayed image; and (2) providing a metallic wiring board with an improved quality for a displayed image by making low the specific resistance of the metallic wiring.

These and other advantages of the present invention will become apparent to those skilled in the art upon reading and understanding the following detailed description with reference to the accompanying figures.

DESCRIPTION OF THE PREFERRED EMBODIMENTS

The present invention will now be described by way of examples.

EXAMPLE 1

Figure 1:
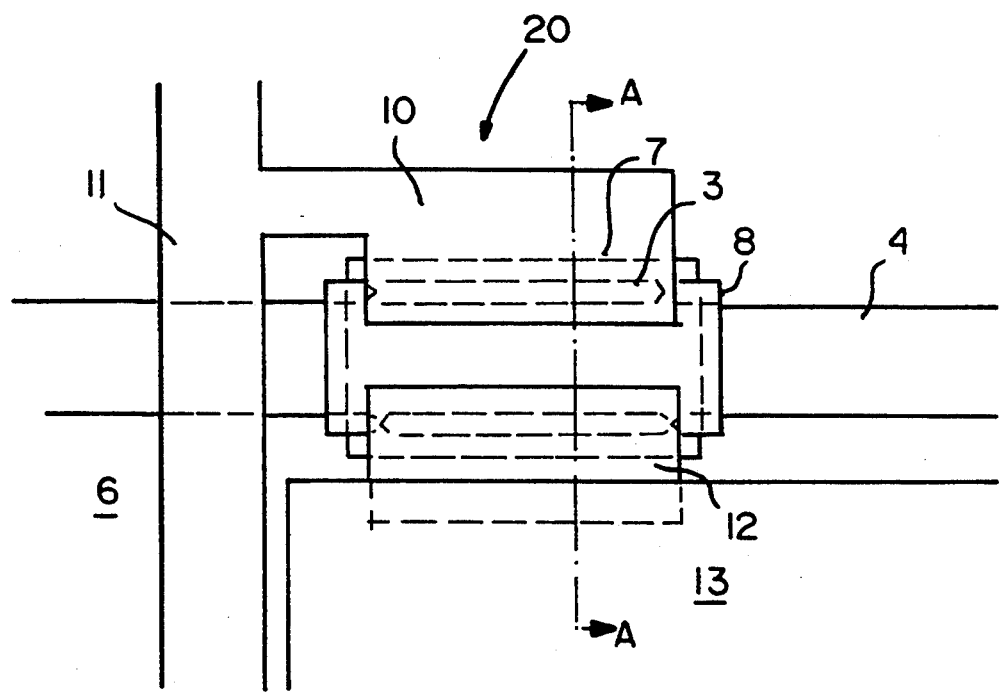
FIG. 1 is a plan view of a TFT portion in a metallic wiring board according to the first example of the present invention.
Figure 2:
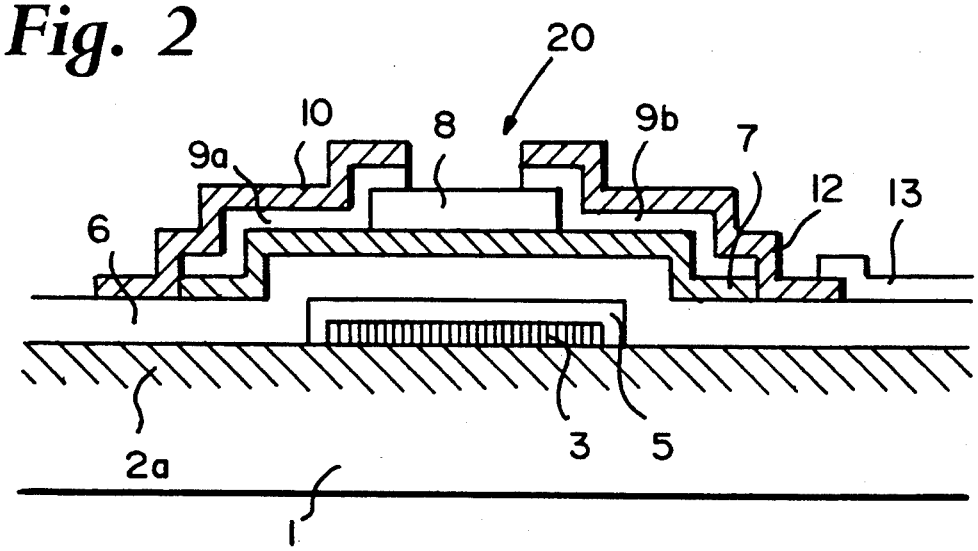
FIG. 2 is a sectional view of the metallic wiring board of FIG. 1 taken on line A—A.

FIG. 1 is a plan view of a TFT portion of a metallic wiring board according to this example. FIG. 2 is a sectional view of the metallic wiring board of FIG. 1 taken on line A—A.

A source line 11 and a gate line 4 are formed on a transparent insulating glass substrate 1 vertically and horizontally, respectively. A TFT 20 is formed near the intersection of the source line 11 and the gate line 4 and works as a switching element for a liquid crystal display.

The metallic wiring board according to this example comprises, as is shown in FIGS. 1 and 2, the glass substrate 1 having an N-doped layer 2a and the gate line 4 formed from Ta on the N-doped layer 2a. The gate line 4 includes a gate electrode 3 for the TFT 20 which is a little wider than the gate line 4. The metallic wiring board further has a first insulating film 5 formed on the gate line 4 (including the gate electrode 3).

The metallic wiring board further has a second insulating film 6 made from $SiN_x$, a semiconductor layer 7 formed from a-Si on the second insulating film 6, a third insulating film 8 formed from $SiN_x$ on the center of the semiconductor layer 7 and semiconductor layers 9a and 9b made from a-Si doped with P. The second insulating film 6 covers the entire top surface of the glass substrate 1 bearing the gate line 4 (including gate electrode 3) and the first insulating film 5. The semiconductor layer 7 is formed above the gate electrode 3. The semiconductor layers 9a and 9b are formed so as to cover the edges of the third insulating film 8 and the whole of the semiconductor layer 7.

The metallic wiring board further has the source line 11 formed from Mo on the second insulating film 6 and a source electrode 10 of the TFT 20 branched from the source line 11. The source electrode 10 covers the whole of the semiconductor layer 9a and part of the second insulating film 6. The metallic wiring board further has a drain electrode 12 made from the same material as used in the source line 11, and a transparent pixel electrode 13 formed from indium oxide on the second insulating film 6. The drain electrode 12 covers the whole of the semiconductor layer 9b and part of the second insulating film 6. The pixel electrode 13 is in contact with the drain electrode 12.

FIGS. 3a through 3g show the production steps for the above-described metallic wiring board. The production method will now be described referring to FIGS. 3a through 3g.

Figure 3E:
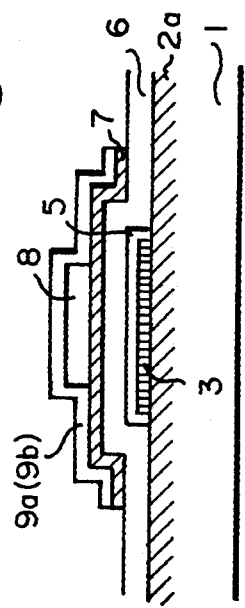
FIGS. 3a through 3g show production steps for the metallic wiring board of FIG. 1.
Figure 3F:
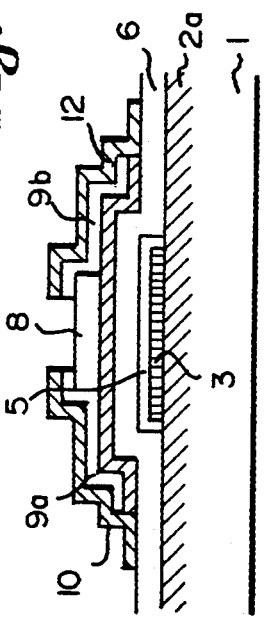
Figure 3G:
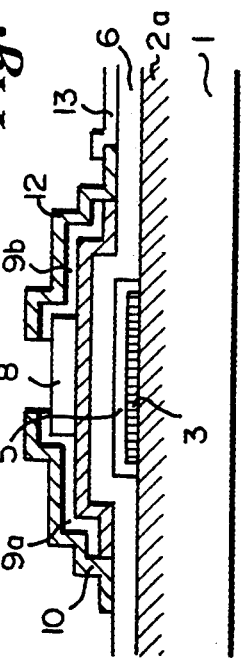
Figure 3A:
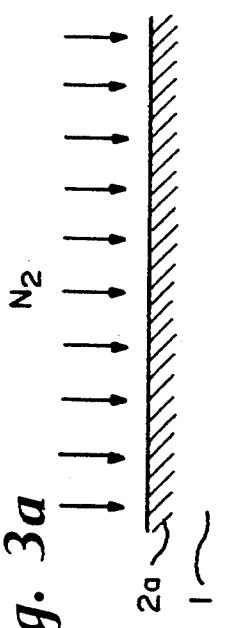

Nitrogen is implanted on the surface of the glass substrate 1 by an ion doping method or a plasma doping method as is shown in FIG. 3a, thereby forming the N-doped layer 2a.

Figure 3B:
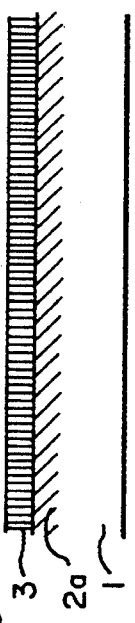

A Ta film or a Nb film with a thickness of, for example, 3000 angstroms is coated on the resultant glass substrate 1 as is shown in FIG. 3b. The surface of the Ta or Nb film is then covered with a mask made from a photoresist film and subjected to an etching, thereby forming the gate line 4 (including the gate electrode 3) with a pattern as shown in FIG. 1.

Figure 3C:
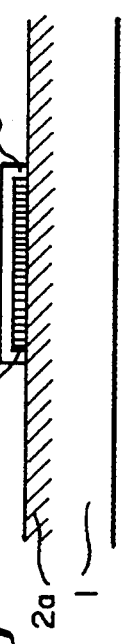

The surface of the gate line 4 (including the gate electrode 3) is then anodic-oxidized, thereby forming the first insulating film 5 as is shown in FIG. 3c.

Figure 3D:
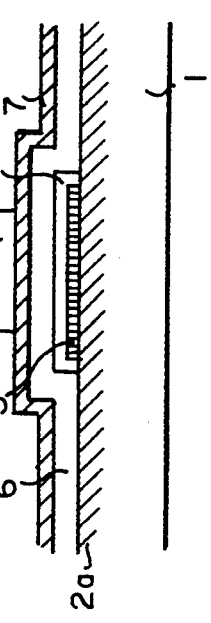

A $SiN_x$ film with a thickness of, for example, 3000 angstroms is formed on the entire top surface of the obtained substrate 1 by the sputtering method or the plasma CVD, thereby forming the second insulating film 6. Then, an a-Si layer and a $SiN_x$ layer each having a thickness of, for example, 3000 angstroms are successively coated thereon by the plasma CVD as the semiconductor layer 7 and the third insulating film 8, respectively. The resultant substrate 1 is subjected to a photoetching, thereby forming the third insulating film 8 having a pattern as shown in FIG. 3d.

On the entire top surface of the obtained substrate 1, a-Si doped with P is coated by the plasma CVD to a thickness of, for example, 1000 angstroms. The edges of the a-Si layer and the P-doped a-Si layer are removed by the photoetching as is shown in FIG. 3e, thereby forming the semiconductor layer 7 and the semiconductor layer 9a (9b).

The resultant substrate 1 is then coated with Mo to a thickness of, for example, 3000 angstroms by the sputtering method, thereby forming a Mo layer. The central portions and the edges of the Mo layer and the semiconductor layers 9a and 9b are removed by etching, thereby forming the source electrode 10 covering the whole of the semiconductor layer 9a and part of the second insulating film 6 and the source line 11 starting from the source electrode 10. The drain electrode 12 is formed in the same manner so as to cover the whole of the semiconductor layer 9b and part of the second insulating film 6.

An indium oxide film with a thickness of, for example, 1000 angstroms is coated on the second insulating film 6 by the sputtering method so as to cover part of the drain electrode 12. The pixel electrode 13 is then formed by the photoetching. The metallic wiring board of this example is thus produced.

Since the glass substrate 1 of the metallic wiring board of this example has the N-doped layer 2a, Ta or Nb ions are prevented from entering the glass substrate 1 during the anodic oxidation of the surface of the gate line 4 (including the gate electrode 3). In this manner, the insulating property of the glass substrate 1 is prevented from being degraded. As a result, a point defect in the liquid crystal display caused by aging can be avoided. Thus, the quality of the displayed image is improved, resulting in improving the reliability of the liquid crystal display.

When Ta is used as a material for the metallic wiring, nitrogen is automatically doped in the Ta film from the N-doped layer 2a on the glass substrate 1 in the initial stage of the sputtering of Ta on the surface of the N-doped layer 2a as mentioned above. As a result, a thin $\alpha$-Ta layer is formed. The Ta layer to be epitaxially grown thereon is an $\alpha$-Ta layer and includes no impurity. Moreover, since the gate line 4, (including the gate electrode 3) is formed from Ta alone in this example, an insulating film can be formed by the anodic oxidation. The production steps are thus simplified. In this manner, in a liquid crystal display using a metallic wiring with a low specific resistance, the quality of the displayed image can be maintained, although the pixel size is minimized to attain a higher resolution since the metallic wiring can be made thin. In addition, such a crystal liquid display can attain a large display screen since the metallic wiring can be made longer without increasing the resistance thereof.

EXAMPLE 2

Figure 4:
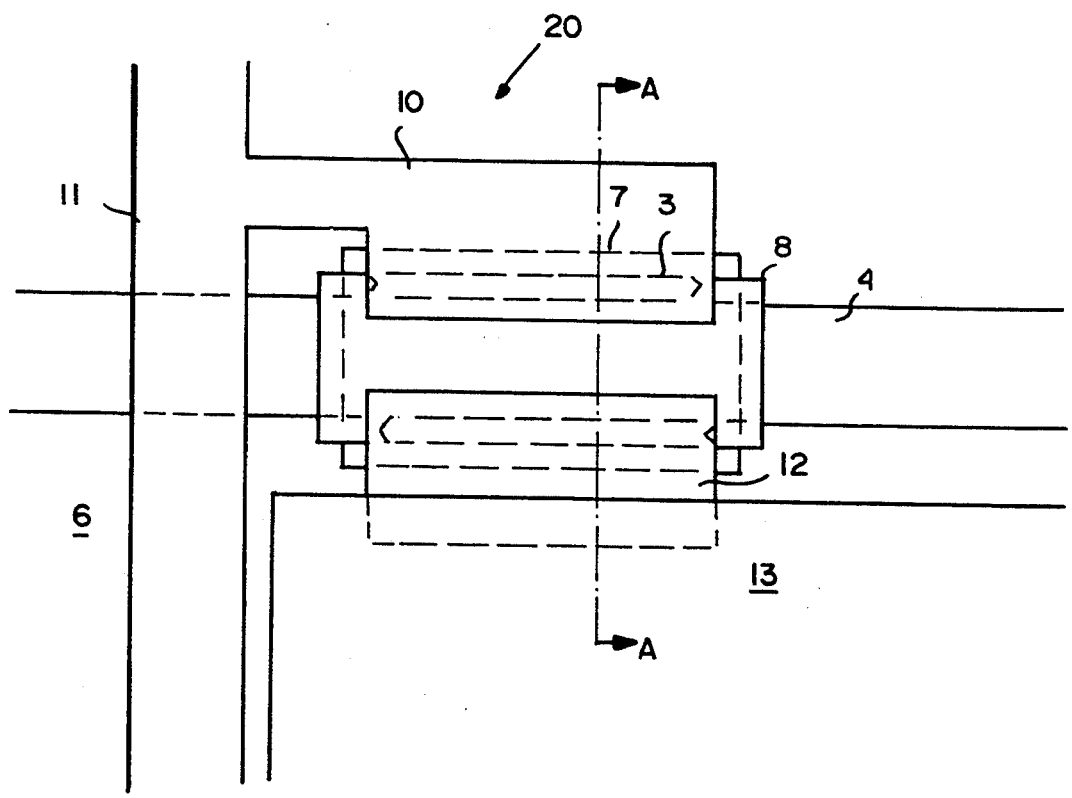
FIG. 4 is a plan view of a TFT portion in a metallic wiring board according to the second example of the present invention.
Figure 5:
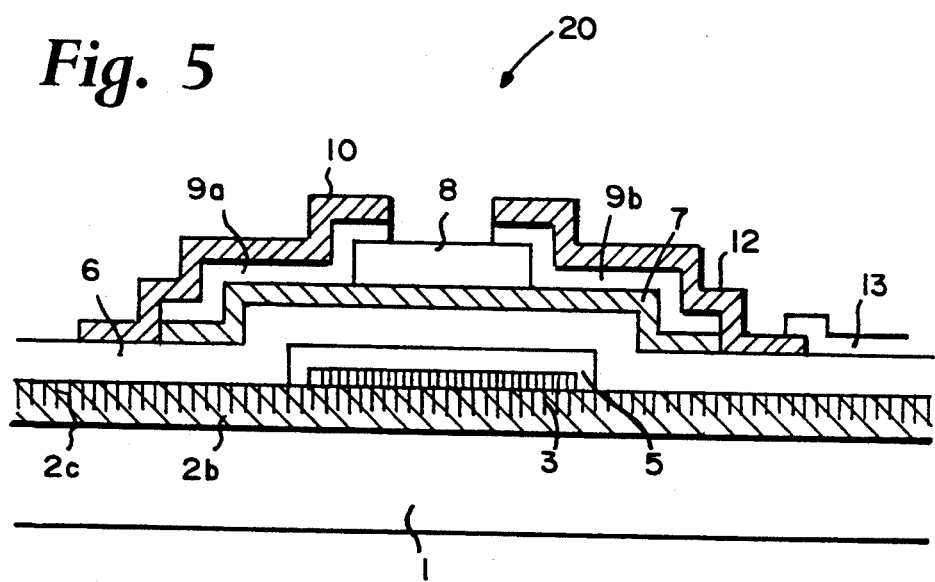
FIG. 5 is a sectional view of the metallic wiring board of FIG. 4 taken on line A—A.
Figure 6:
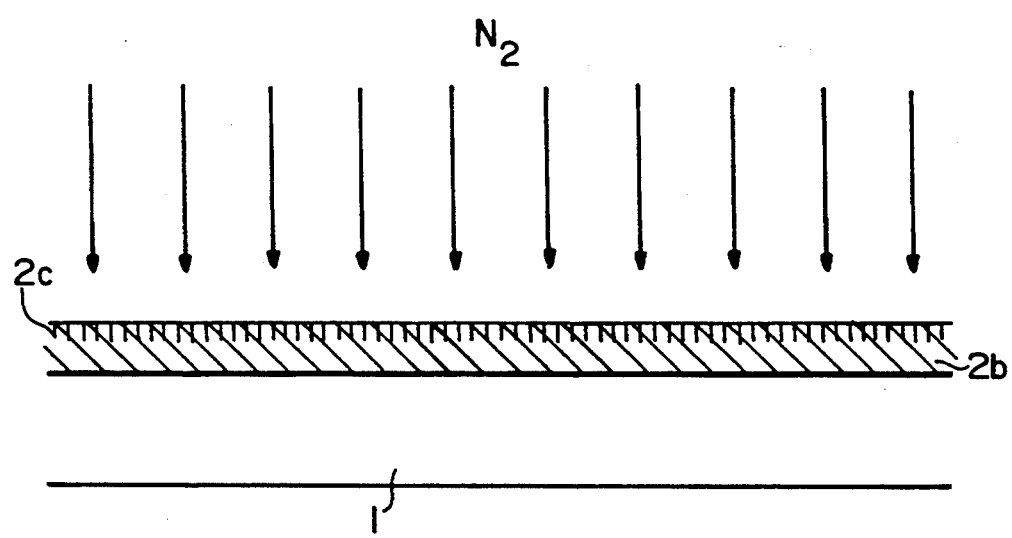
FIG. 6 shows one of the production steps for the metallic wiring board of FIG. 4.

FIG. 4 is a plan view of a TFT portion of a metallic wiring board of this example. FIG. 5 is a sectional view of the metallic wiring board of FIG. 4 taken on line A—A. FIG. 6 shows one of the production steps for the metallic wiring board of FIG. 4. Like reference numerals are used to refer to like elements throughout.

The metallic wiring board has, as is shown in FIGS. 4 and 5, an insulating glass substrate 1 at the bottom and a protective layer 2b covering the whole top surface of the substrate 1. An N-doped layer 2c is formed on the protective layer 2b. The metallic wiring board further has a gate line 4 (including a gate electrode 3) formed from Ta or Nb on the N-doped layer 2c and a first insulating film 5 formed on the gate line 4 (including the gate electrode 3). The other elements constituting this metallic wiring board are the same as those in Example 1.

The production method for this metallic wiring board is as follows: As is shown in FIG. 6, a film made from $SiO_2$, $SiN_x$ or $Ta_2O_5$ is formed on the surface of the glass substrate 1 as the protective layer 2b. Nitrogen is implanted in the protective layer 2b by the ion doping method or the plasma doping method to form the N-doped layer 2c. The gate line 4 (including the gate electrode 3) and the other elements are formed on the N-doped layer 2c in the same manner as in Example 1.

Since the metallic wiring board of this example has the N-doped layer 2c, Ta or Nb ions are prevented from entering the protective layer 2b in the anodic oxidation of the surface of the gate line 4 (including the gate electrode 3). Thus, the insulating property of the protective layer 2b is prevented from being degraded. As a result, a point defect in the liquid crystal display caused by aging can be avoided, thereby attaining the same effect as in Example 1.

When Ta is used as a material for the metallic wiring, nitrogen is automatically doped in the Ta film from the N-doped layer 2c on the glass substrate 1 in the initial stage of the sputtering of Ta on the surface of the N-doped layer 2c on the protective layer 2b as mentioned above. As a result, a thin α-Ta layer is formed. The Ta layer to be epitaxially grown thereon is an α-Ta layer and includes no impurity. In this manner, the gate line 4 (including the gate electrode 3) with a low specific resistance can be obtained without complicating the production steps, resulting in attaining the same effect as in Example 1.

EXAMPLE 3

Figure 7:
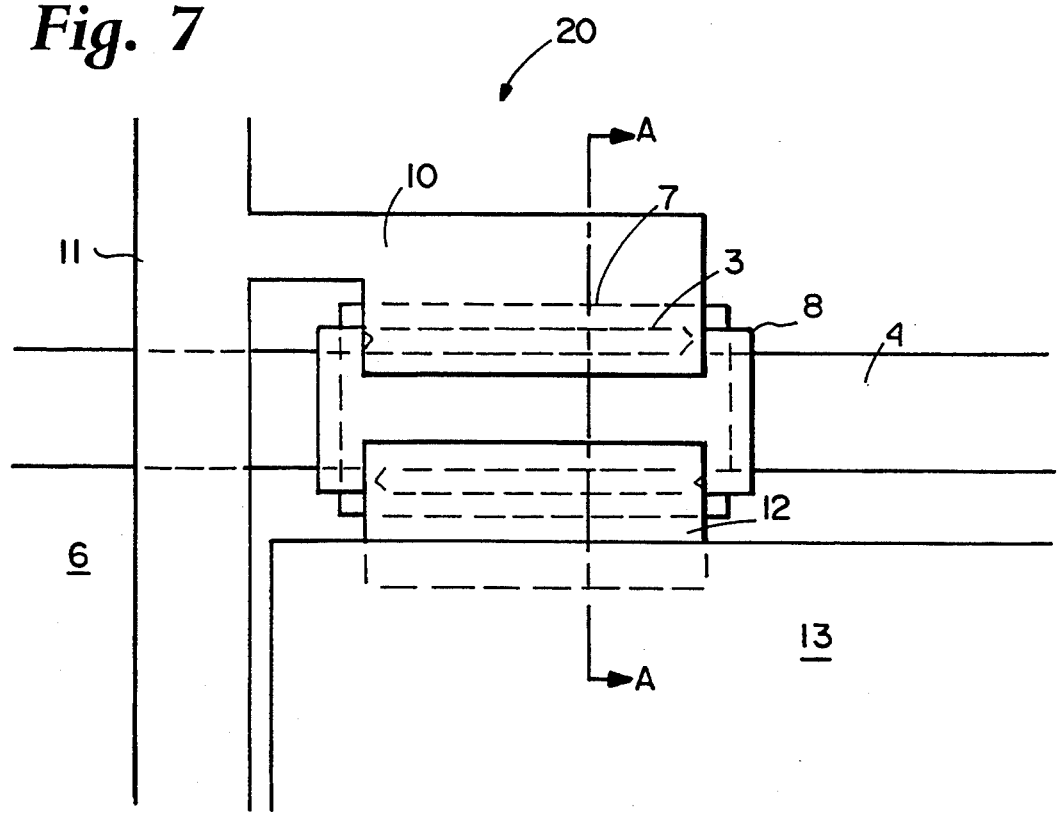
FIG. 7 is a plan view of a TFT portion in a metallic wiring board according to the third example of the present invention.
Figure 8:
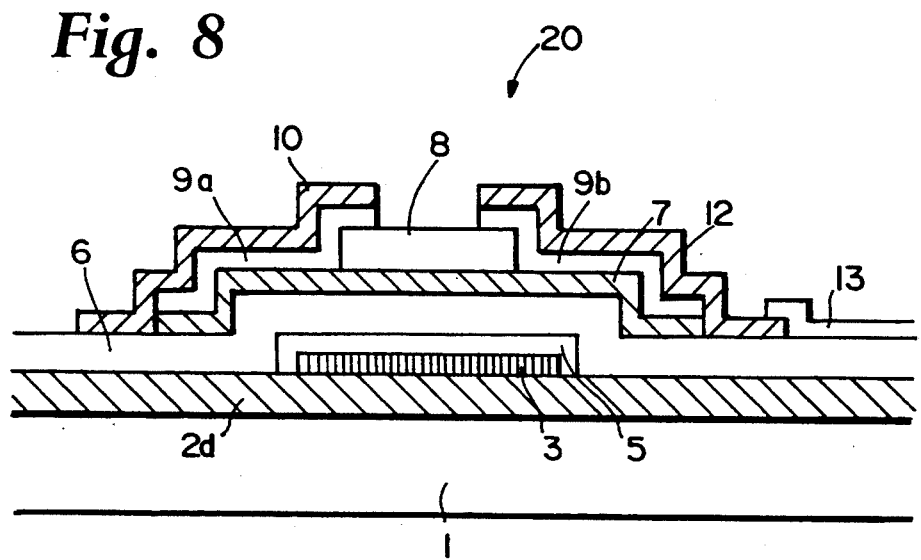
FIG. 8 is a sectional view of the metallic wiring board of FIG. 7 taken on line A—A.

FIG. 7 is a plan view of a TFT portion of a metallic wiring board of this example, and FIG. 8 is a sectional view of the metallic wiring board taken on line A—A.

The metallic wiring board has, as is shown in FIGS. 7 and 8, an insulating glass substrate 1 at the bottom and a protective layer 2d including nitrogen formed on the glass substrate 1. The metallic wiring board further has a gate line 4 (including a gate electrode 3) formed from Ta or Nb on the protective layer 2d and a first insulating film 5 formed on the gate line 4 (including the gate electrode 3). The other elements constituting the metallic wiring board are the same as those in Example 1.

The production method for the metallic wiring board is as follows: A film made from $SiO_2$, $SiN_x$ or $Ta_2O_5$ including nitrogen is formed on the glass substrate 1 as the protective layer 2d. The gate line 4 (including the gate electrode 3) and the other elements constituting the metallic wiring board are formed on the protective layer 2d in the same manner as in Example 1.

Since the protective layer 2d of the metallic wiring board of this example includes nitrogen, Ta or Nb ions are prevented from entering the protective layer 2d during the anodic oxidation of the surface of the gate line 4 (including the gate electrode 3). The insulating property of the protective layer 2d is thus prevented from being degraded. As a result, the same effect as in Examples 1 and 2 can be attained.

When Ta is used as a material for the metallic wiring, nitrogen is automatically doped in the Ta film from the protective layer 2d on the glass substrate 1 in the initial stage of the sputtering of Ta on the surface of the protective layer 2d including nitrogen as mentioned above. As a result, a thin α-Ta layer is formed. The Ta layer to be epitaxially grown thereon is an α-Ta layer and includes no impurity. In this manner, the gate line 4 (including the gate electrode 3) with a low specific resistance can be obtained without complicating the production steps. In this manner, a liquid crystal display with a large display screen and a high resolution can be realized while maintaining the quality of the displayed image.

EXAMPLE 4

This example is the same as Example 3 except that the protective layer 2d is made from $Ta_2O_5$ including nitrogen.

The production method for this metallic wiring board is as follows: A Ta film with a thickness of 500 to 2000 angstroms is formed on the glass substrate 1 by the sputtering method using Ar. Nitrogen is introduced into the Ar during the sputtering method so that the partial pressure of $N_2$ is approximately 0.05 Pa or less. The Ta film thus produced is heat-oxidized by using $O_2$ or a mixture of $O_2$ and $N_2$ at a temperature of 500° C. or more, thereby forming a $Ta_2O_5$ layer as the protective layer 2d.

Next, a Ta film or a Nb with a thickness of, for example, 3000 angstroms is coated on the obtained $Ta_2O_5$ protective layer 2d by the sputtering method. The gate line 4 (including the gate electrode 3) is then formed by patterning. The surface of the gate line 4 (including the gate electrode 3) is anodic-oxidized to form the first insulating film 5.

The second insulating film and the other elements constituting the metallic wiring board are formed in the same manner as in Example 1.

Figure 9:
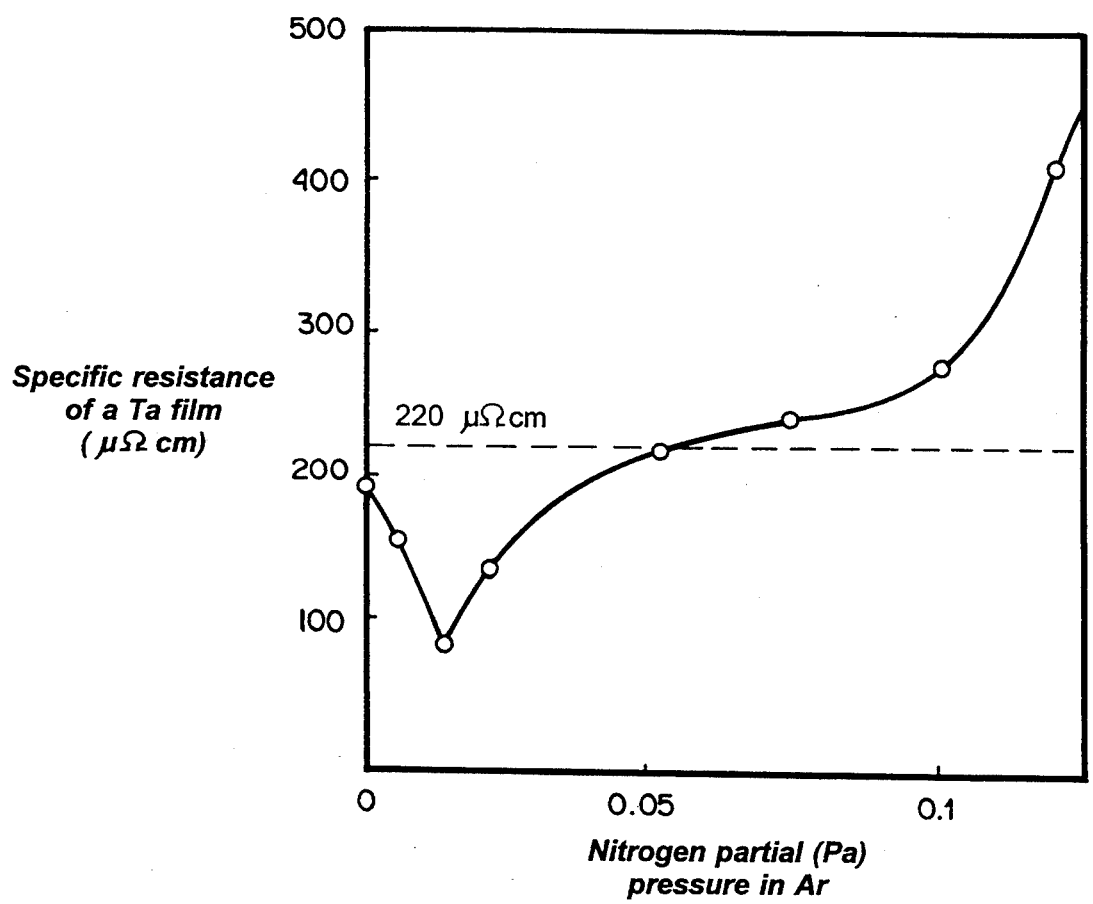
FIG. 9 shows the relationship between a nitrogen partial pressure in Ar and the specific resistance of a Ta film when the Ta film is formed by the sputtering method.

It is known that the specific resistance of the Ta film varies as shown in FIG. 9 when the Ta film is formed by the sputtering method using Ar including $N_2$. Moreover, among $Ta_2O_5$ layers obtained by the heat oxidation of the Ta film with different specific resistance, when the Ta film formed thereon as the gate line 4 (including the gate electrode 3) is anodic-oxidized under the same condition as in this example, the insulating property of the $Ta_2O_5$ protective layers 2d obtained from the Ta film with a specific resistance of 220 $\mu\Omega$cm or more are known to degrade.

In this example, since the partial pressure of $N_2$ during the sputtering method is approximately 0.05 Pa or less, the specific resistance of the formed Ta film is 220 $\mu\Omega$cm or less. Therefore, the insulating property of the protective layer 2d of this example is not degraded during the anodic oxidation for forming the gate line 4 (including the gate electrode 3). In the resultant liquid crystal display, point defects are prevented and the quality of the displayed image is improved.

EXAMPLE 5

Figure 10:
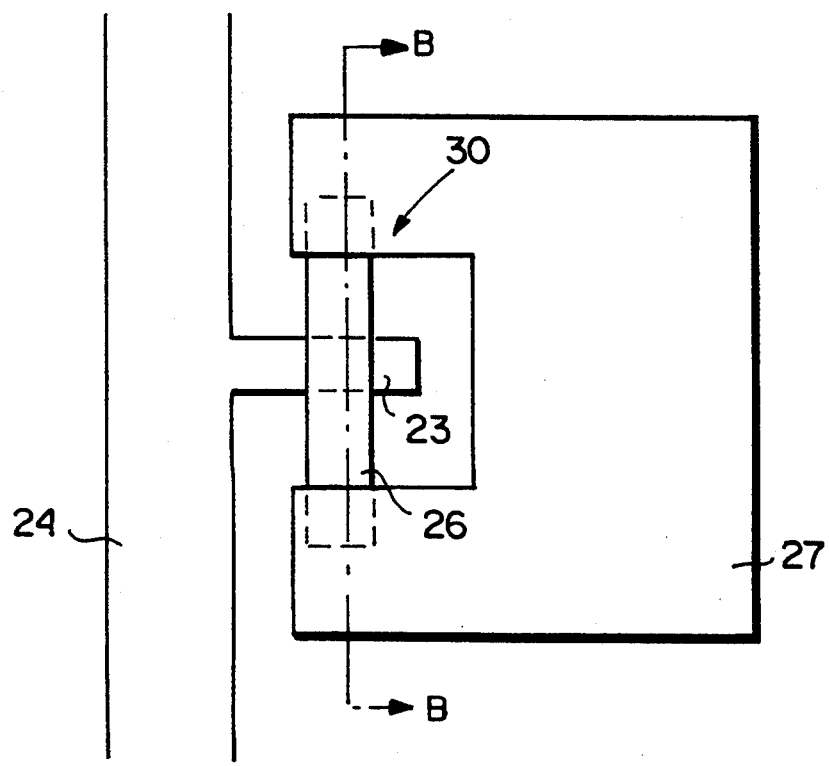
FIG. 10 is a plan view of an MIM element portion of a metallic wiring board according to the fifth example of the present invention.
Figure 11:
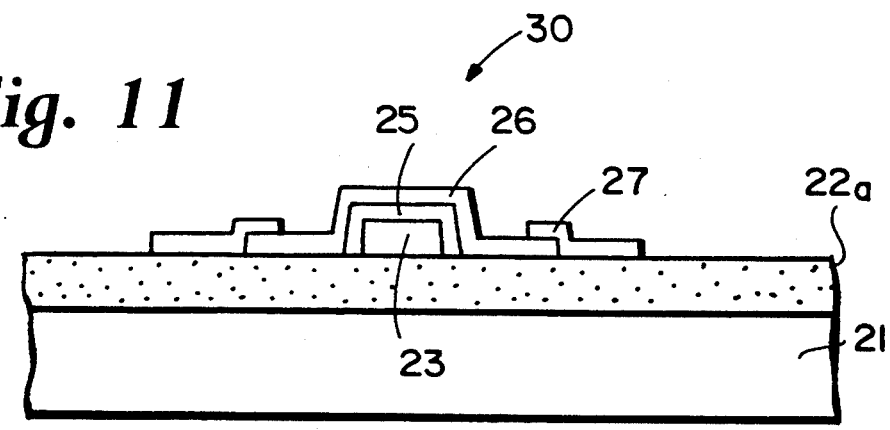
FIG. 11 is a sectional view of the metallic wiring board of FIG. 10 taken on line B—B.

FIG. 10 is a plan view of an MIM (metal-insulator-metal) element portion in a metallic wiring board of this example. FIG. 11 is a sectional view of the metallic wiring board of FIG. 10 taken on line B—B.

In this metallic wiring board, an MIM element 30 is formed on a transparent insulating glass substrate 21 in the form of a matrix and works as a switching element for a liquid crystal display.

The metallic wiring board has, as is shown in FIGS. 10 and 11, the glass substrate 21 at the bottom, an N-doped layer 22a formed by doping the entire top surface of the glass substrate 21 with nitrogen, a scanning line 24 made from Ta or Nb, and an insulating film 25 formed on the scanning line 24. The scanning line 24 includes a first electrode 23 of the MIM element 30 branched from the scanning line 24. The metallic wiring board further has a second electrode 26 formed above the first electrode 23 having the insulating film 25 sandwiched therebetween and a transparent pixel electrode 27 formed so as to come in contact with the second electrode 26. The second electrode 26 is made from Ti, chromium (Cr) or aluminum (Al), and the pixel electrode 27 is made from indium oxide.

FIGS. 12a through 12d show the production steps for the above-mentioned metallic wiring board. The production method for the metallic wiring board will now be described referring to FIGS. 12a through 12d.

Figure 12A:
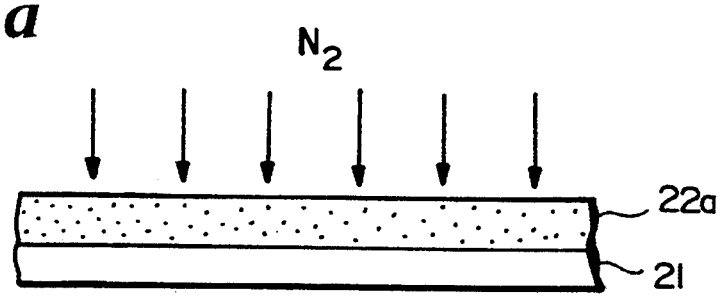
FIGS. 12a through 12d show production steps for the metallic wiring board of FIG. 10.

Nitrogen is implanted on the surface of the glass substrate 21 by the ion doping method or the plasma doping method as is shown in FIG. 12a to form the N-doped layer 22a.

Figure 12B:
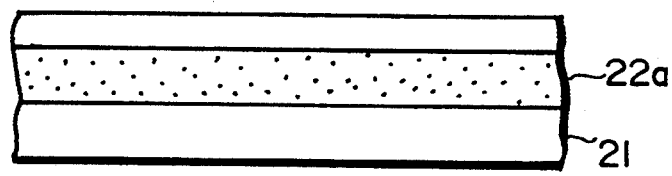

A Ta or Nb layer with a thickness of, for example, 3000 angstroms is coated on the glass substrate 21 by the sputtering method as is shown in FIG. 12b. The surface of the Ta or Nb layer is covered with a mask made from a photoresist film and then subjected to the etching, thereby forming the scanning line 24 (including the first electrode 23) with a pattern as shown in FIG. 10.

Figure 12C:
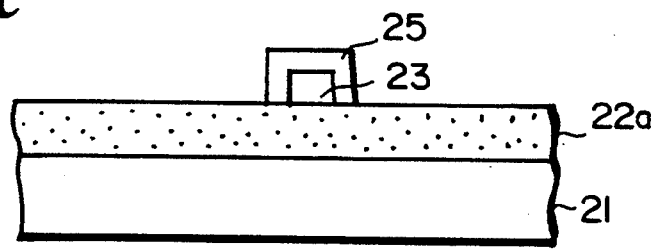

The surface of the scanning line 24 (including the first electrode 23) is then anodic-oxidized as is shown in FIG. 12c to form the insulating film 25.

Figure 12D:
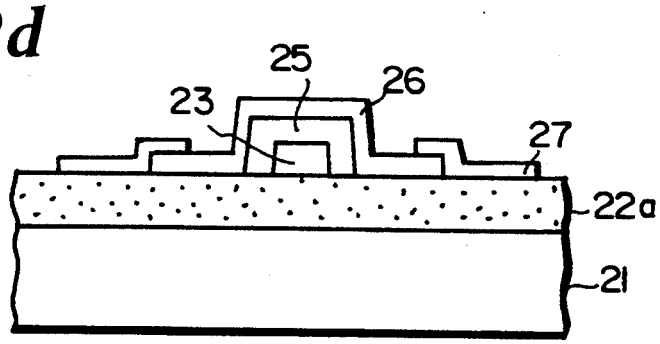
Figure 13:
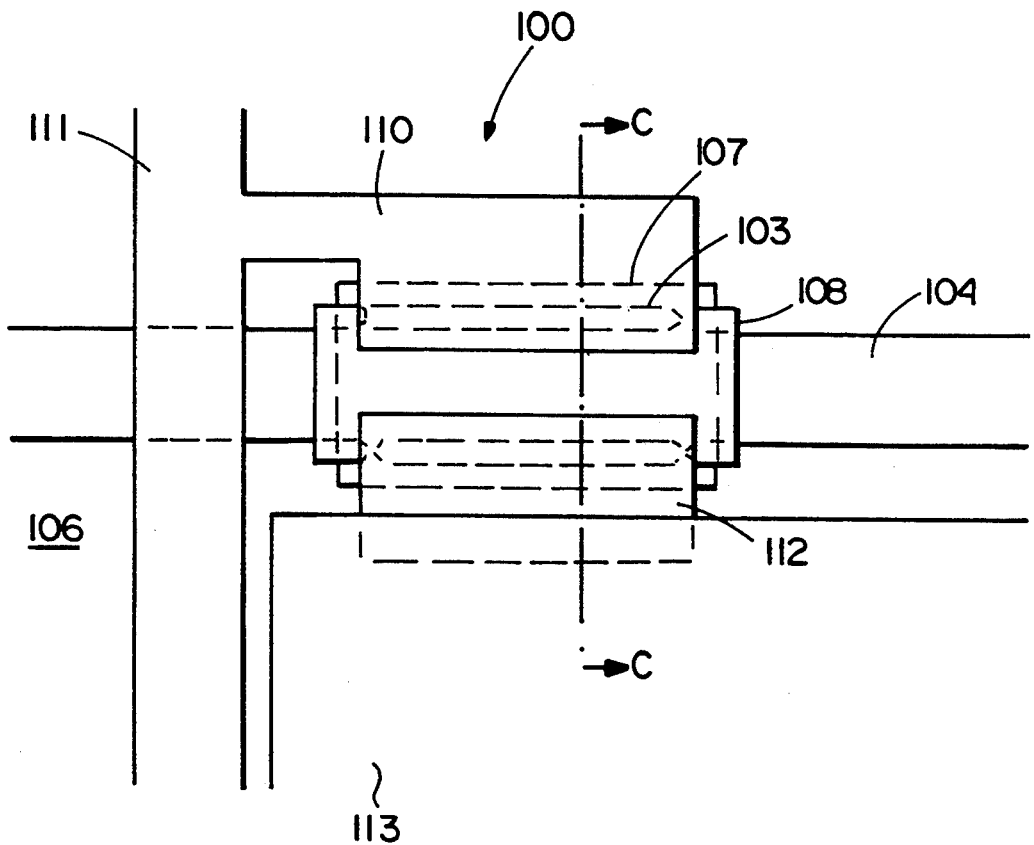
FIG. 13 is a plan view of a TFT portion of a conventional metallic wiring board.
Figure 14:
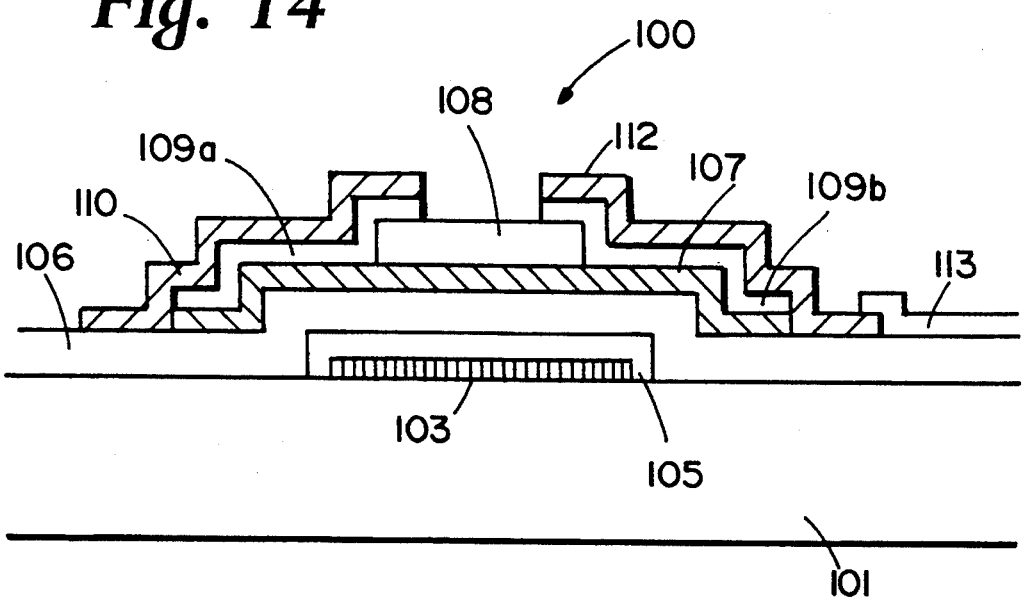
FIG. 14 is a sectional view of the metallic wiring board of FIG. 13 taken on line C—C.

Next, Ti, Cr or Al is coated on the resultant substrate to a thickness of, for example, 3000 angstroms by the sputtering method, thereby forming the second electrode 26 as is shown in FIG. 12d.

An indium oxide layer with a thickness of, for example, 1000 angstroms is formed so as to partly cover the second electrode 26 by the sputtering method, and then, the pixel electrode 27 is formed. The metallic wiring board of this example is thus produced.

This example also provides the same effect as in Example 1.

The structure of the metallic wiring board according to the present invention is not limited to those described in the above-mentioned examples, but includes any other structure in which a metal material including Ta or Nb as a main component is used for a wiring.

As is obvious from the above description, according to the metallic wiring board of the present invention, point defects in the liquid crystal display can be reduced by preventing the degradation of the insulating property of the substrate and the protective layer. As a result, the quality of the displayed image can be improved and the liquid crystal display can attain a high reliability.

In addition, when Ta is used as a material for the metallic wiring, the specific resistance of the metallic wiring can be reduced by using the conventional production method. Thus, a display device with a large screen and a high resolution can be attained while maintaining the quality of the displayed image.

It is reported that the insulating property of a capacitor can be stabilized by using $\alpha$-Ta highly doped with nitrogen in forming an anodic-oxidized $Ta_2O_5$ layer, that is, a dielectric substance used as the capacitor ("Aging of Highly N-Doped $\alpha$-Ta Thin-Film Capacitors", Peter W. Wyatt, IEEE Transactions on Components, Hybrids, and Manufacturing Technology, vol. CHMT-1, No. 2, pp. 148-151). It is known, however, that a $Ta_2O_5$ film including no nitrogen is formed on the uppermost portion when a Ta film including nitrogen is anodic-oxidized. The technique reported as above is different from the present invention where the $Ta_2O_5$ film is formed by heat oxidization.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A metallic wiring board comprising:
   a substrate including nitrogen impurities implanted in a surface of the substrate, and
   a tantalum wiring formed on the surface of the substrate.

2. A metallic wiring board comprising:
   a substrate;
   a protective layer including nitrogen formed on the surface of the substrate; and
   Ta wiring formed on the protecitve layer.

3. A metallic wiring board according to claim 2, wherein the protective layer is made from a material including, as a main component, one of $SiO_2$, $SiN_x$ and $Ta_2O_5$.

4. A metallic wiring board, comprising:
   a substrate including nitrogen impurities implanted in a surface of the substrate;
   a metallic wiring formed on the substrate surface and made from a metal including, as a main component, one of Ta and Nb; and
   an anodic-oxidized insulation layer formed on the metallic wiring.

5. A metallic wiring board comprising:
   a substrate;
   a protective layer including nitrogen and formed on a surface of the substrate;
   a metallic wiring formed on the protective layer and made from a metal including, as a main component, one of Ta and Nb; and
   an anodic-oxidized insulation layer formed on the metallic wiring.

6. A metallic wiring board according to claim 5 wherein the protective layer is made from a material including, as a main component, one of $SiO_2$, $SiN_x$ and $Ta_2O_5$.

7. A metallic wiring board comprising:
   a substrate having a surface region implanted with nitrogen; and
   a wiring formed on the substrate by a sputtering method, the wiring including $\alpha$-Ta.

8. A metallic wiring board comprising:
   a substrate;
   an insulating layer formed on the substrate, the insulting layer including nitrogen; and a wiring formed on the insulating layer by a sputtering method, the wiring including α-Ta.

9. A thin film transistor comprising:

a substrate including nitrogen impurities implanted in a surface of the substrate;

a gate electrode formed on the substrate, the gate electrode being made from tantalum;

an insulating film formed over the gate electrode;

a semiconductor layer formed over the insulating film; and a source electrode and a drain electrode formed on the semiconductor layer.

10. A thin film transistor comprising:

a substrate;

a protective layer formed on the substrate, the protective layer including nitrogen;

a gage electrode formed on the protective layer, the gate electrode being made from tantalum;

an insulating film formed over the gate electrode;

a semiconductor layer formed over the insulating film; and a source electrode and a drain electrode formed on the semiconductor layer.

11. A metallic wiring board according to claim 1, wherein the tantalum wiring includes a thin α-Ta layer doped with a part of the nitrogen impurities implanted in the substrate and a second α-Ta layer substantially including no impurity, wherein the thin α-Ta layer is formed on the substrate and the second α-Ta layer is formed on the thin α-Ta layer.

12. A metallic wiring board according to claim 2, wherein the tantalum wiring includes a thin α-Ta layer doped with a part of the nitrogen included in the protective layer and a second α-Ta layer substantially including no impurity, wherein the thin α-Ta layer is formed on the protective layer and the second α-Ta layer is formed on the thin α-Ta layer.

13. A metallic wiring board according to claim 7, wherein the wiring includes a thin α-Ta layer doped with a part of the nitrogen implanted in the substrate and a second α-Ta layer substantially including no impurity, wherein the thin α-Ta layer is formed on the substrate and the second α-Ta layer is formed on the thin α-Ta layer.

14. A metallic wiring board according to claim 8, wherein the wiring includes a thin α-Ta layer doped with a part of the nitrogen included in the insulating layer and a second α-Ta layer substantially including no impurity, wherein the thin α-Ta layer is formed on the insulating layer and the second α-Ta layer is formed on the thin α-Ta layer.

15. A metallic wiring board according to claim 9, wherein the gate electrode includes a thin α-Ta layer doped with a part of the nitrogen impurities implanted in the substrate and a second α-Ta layer including substantially no impurity, wherein the thin α-Ta layer is formed on the substrate and the second α-Ta layer is formed on the thin α-Ta layer.

16. A metallic wiring board according to claim 10, wherein the gate electrode includes a thin α-Ta layer doped with a part of the nitrogen included in the protective layer and a second α-Ta layer substantially including no impurity, wherein the thin α-Ta layer is formed on the protective layer and the second α-Ta layer is formed on the thin α-Ta layer.

* * * * *

UNITED STATES PATENT AND TRADEMARK OFFICE
CERTIFICATE OF CORRECTION

PATENT NO. : 5,434,363
DATED     : July 18, 1995
INVENTOR(S) : Masahito Goto et al It is certified that error appears in the above-indentified patent and that said Letters Patent is hereby corrected as shown below:

On the title page: Item

--[30] Foreign Application Priority Data

Aug. 5, 1992   [JP]   Japan ...................4-209299--.

Column 11, line 17, in claim 10, delete "gage" and insert --gate--.

Column 12, line 19, in claim 15, delete "metallic wiring board" and insert --thin film transistor--.

line 26, in claim 16, delete "metallic wiring board" and insert --thin film transistor--.

Signed and Sealed this

Seventh Day of May, 1996

Attest:

BRUCE LEHMAN

Attesting Officer     Commissioner of Patents and Trademarks